United States Patent [19]

Davidson et al.

[11] Patent Number: 4,985,686

[45] Date of Patent: Jan. 15, 1991

[54] ACTIVE LOAD IMPEDANCE CONTROL SYSTEM FOR RADIO FREQUENCY POWER AMPLIFIERS

[75] Inventors: Robert P. Davidson, Chandler, Ariz.; Richard A. Rose, Hoffman Estates, Ill.

[73] Assignee: Motorola, Inc., Schaumburg, Ill.

[21] Appl. No.: 446,228

[22] Filed: Dec. 4, 1989

[51] Int. Cl.$^5$ ............................................. H03F 3/68
[52] U.S. Cl. .................................. 330/124 R; 330/295; 455/123
[58] Field of Search .................. 330/151, 124 R, 295; 333/17.3; 343/861; 455/117, 120, 123, 125

[56] References Cited

U.S. PATENT DOCUMENTS

| 4,439,741 | 3/1984 | Turner, Jr. | 330/149 |
| 4,493,112 | 1/1985 | Bruene | 333/17.3 X |

*Primary Examiner*—James B. Mullins
*Attorney, Agent, or Firm*—Daniel K. Nichols

[57] ABSTRACT

An active load impedance control system for a radio frequency power amplifier comprising an amplification means for amplifying radio frequency signals and providing a forward signal, a control means responsive to the operating conditions of said amplification means, a correction signal means responsive to the control means for providing an amplitude, a sampling means and phase controlled corrective reflective signal and a combining means for combining said forward signal and said corrective reflective signal.

7 Claims, 1 Drawing Sheet

ACTIVE LOAD IMPEDANCE CONTROL SYSTEM FOR RADIO FREQUENCY POWER AMPLIFIERS

TECHNICAL FIELD

This invention relates generally to the field of radio frequency (RF) power amplifiers, and more specifically to the tuning of radio frequency power amplifiers.

BACKGROUND ART

The major problem in reducing the size of the higher power mobile radios and high power continuous duty base stations are the size requirements for the RF power amplifier heatsink. The size of the heatsink is inversely proportional to the efficiency for the RF power amplifier. That is, the higher the efficiency of the RF power amplifier, the smaller the size of the heatsink. At "peak" efficiency of the RF power amplifier, the heatsink is small. However, broadband RF power amplifiers never operate at "peak" efficiency over all operating conditions. The RF power amplifier would have to be tuned for the varying operation conditions of fundamental frequency, supply voltage, temperature, output power an actual antenna impedance. To operate at "peak" efficiency all of the time, the RF power amplifier would have to have the capability to tune itself as operation conditions vary.

Attempts have been made to improve the efficiency of RF power amplifiers. These methods have incorporated the use of active output matching networks and harmonic wave shaping. In U.S. Pat. No. 4,439,741 and other similar designs, a switching network, responsive to the operating conditions of the RF power amplifier, is used to switch to an alternate output matching network of the RF power amplifier. Accordingly, a need exists for RF power amplifiers that will operate at "peak" efficiency over all operating conditions, resulting in the reduction of the size of the heatsink.

SUMMARY OF THE INVENTION

Accordingly, it is an object of the present invention to design a RF power amplifier that operates at "peak" efficiency over varying operation conditions.

Briefly, according to the invention, an active load impedance control system for a radio frequency power amplifier comprising an amplification means for amplifying radio frequency signals and providing a forward signal, a control means responsive to the operation conditions of said amplification means, a correction signal means responsive to the control means for providing an amplitude and phased controlled corrective reflective signal and a combining means for combining said forward signal and said corrective reflective signal.

DETAILED DESCRIPTION OF THE PREFERRED EMBODIMENT

Figure 1:
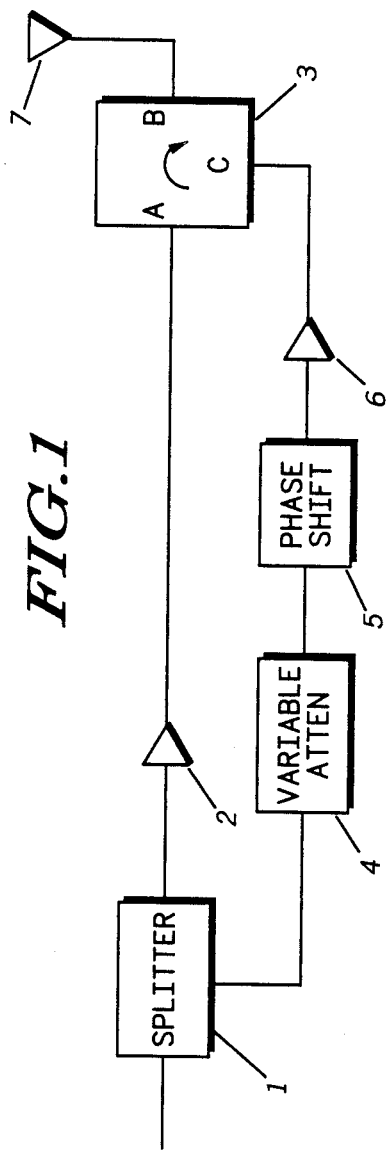
FIG. 1 is a schematic diagram of an active load impedance control system for radio frequency power amplifiers in accordance with the present invention.

Referring to FIG. 1, a schematic diagram of an active load impedance control system for radio frequency power amplifiers that provides peak efficiency of the RF power amplifier over varying conditions of fundamental frequencies, supply voltage, temperature, and output power, is shown. This system comprises of a RF power amplifier 2 comprising amplification means and an impedance matching network. The adjustment of the impedance seen by amplifier 2 is accomplished by an active load generator. The complex impedance presented to the RF power amplifier is determined by the forward and reflective signals of the system as present at the amplifier output. The present invention provides a system that can generate a reflective signal which when combined with the forward signal produces the load impedance that will give "peak" efficiency of the RF power amplifier or other characteristics such as gain or stability, regardless of operating conditions. The reflective signal is generated by a variable attenuator 4, phase shifter 5 and amplifier 6 comprising the active load generator in addition to combining means 3 and sampling means 1.

The load impedance used to tune the RF power amplifier 2 in the present invention is generated in the following manner. A fundamental or operating radio signal is provided to splitter 1. The splitter provides two signals. The first signal is the subsequently amplified radio signal. The second signal is a sample of the radio signal. The first signal is received by the RF power amplifier 2, which provides a corresponding amplified signal or the forward signal. The second signal, which is a sample of the radio signal, is provided to variable attenuator 4, where the amplitude of the signal is varied in response to the operating conditions of the RF power amplifier 2. The phase of the resulting signal of the variable attenuator 4 is shifted at phase shifter 5 in response to the operating conditions of the RF power amplifier 2. The amplifier 6 adjusts the gain of the signal provided by the phase shifter 5 in accordance to the operating conditions of the RF power amplifier 2. The signal provided by the amplifier 6 is the corrective reflective signal.

The forward signal and the corrective reflective signal are received at circulator 3, constituting a combining means for producing the complex impedance at the output of amplifier 2. For very high frequencies, a branch line coupler may be used in the place of circulator 3. Circulator 3 is a three port combining device with a 50 ohms characteristic impedance. Circulator 3 works in the following manner: a signal that is received at port A appears as an output signal at port B. A signal that is received at port B appears as an output signal at port C. A signal that is received at port C appears as an output signal at port A. Circulator 3 provides the corrective reflective signal and not the reflective signal from the antenna 7 to the amplifier output. The reflective signal from the antenna 7 is output at port C, thus the load is virtually isolated making the RF power amplifier independent of varying loads. The fact that the corrective reflected signal is responsive to the RF power amplifier allows the complex impedance generated by the active load generator to tune the RF power amplifier over varying operating conditions. Because of the load isolation provided by circulator 3, some final transistor ruggedness could be traded for optimized transistor efficiency and gain.

Figure 2:
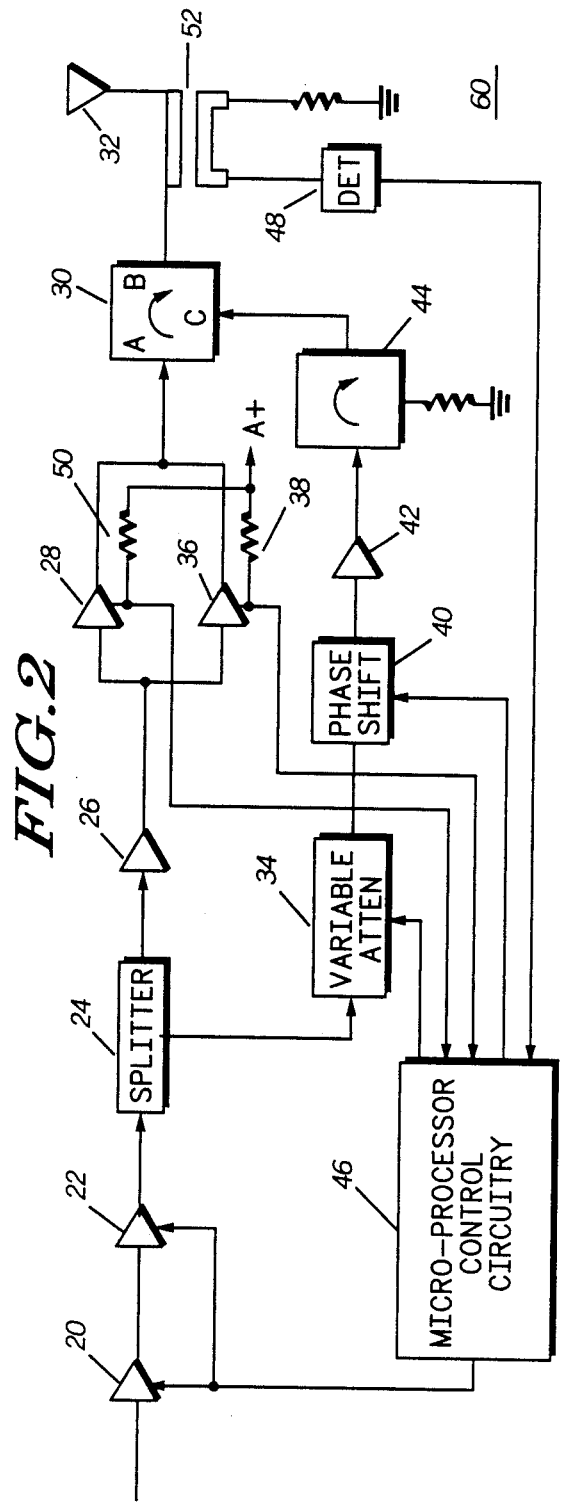
FIG. 2 is another schematic diagram of another active load impedance control system for radio frequency power amplifiers in accordance with the present invention.

FIG. 2 refers to a schematic drawing of another embodiment of an active load impedance control system for RF power amplifiers 60. A radio signal is provided to the amplifier 20, which provides an amplified signal to amplifier 22. The output signal of amplifier 22 is received by splitter 24. The splitter provides two signals. The first signal is the subsequently amplified radio signal. The second signal is a sample of the radio signal. The first signal is received by amplifier 26, which provides a corresponding amplified signal. The signal is received at the input of amplifiers 28 and 36, which are connected in parallel. The amplified output signal of amplifiers 28 and 36 is the forward signal. The forward signal is received at circulator 30, where it is combined with the corrective reflective signal, thereby determining the complex impedance of the amplifiers 28 and 36. A signal from the parallel amplifiers is received at micro-processor 46, which is responsive to the output of amplifiers 28 and 36. Port A+ is connected to a battery which supplies voltage to the RF power amplifier 60. Port A+ is connected to resistors 50 and 38, which are connected to amplifiers 28 and 36, respectively. Resistors 50 and 38 are very small in value (such as 10 milliohms). Resistors 50 and 38 are connected to the microprocessor 46. By determining the voltage across the resistors 50 and 38, the input current and power to the amplifiers can be calculated by micro-processor 46. Output power detector 48 is connected to microprocessor 46. Antenna 32 is coupled to output power detector 48 via directional coupler 52. Detector 48 senses the forward output power of the RF power amplifier 60 and relays this information to the microprocessor 46. The RF power amplifier's efficiency is determined by the micro-processor, based on the values of input and output powers.

Micro-processor 46, which comprises control means, is responsive to several parameters of the RF power amplifier 60. These parameters include supply voltage, final device current and output power of the RF power amplifier. In responsive to these parameters microprocessor 46 will activate variable attenuator 34 and phase shifter 40 to adjust the amplitude and phase of the corrective reflective signal of the RF power amplifier. The corrective reflective signal is combined with forward signal to determine the complex impedance used to tune the RF power amplifier. The ability of the corrective reflective signal to be adjusted in response to the operating conditions of the RF power amplifier provides a RF power amplifier that can be adjusted for high operating efficiency. Micro-processor 46 adjusts the supply voltage and gain of amplifiers 20 and 22 in responsive to the operating conditions of the RF power amplifier 60.

The second signal, which is a sample of the radio signal, is provided to variable attenuator 34, where the amplitude of the signal is varied in response to the signal provided from micro-processor 46. The phase of the resulting signal of the variable attenuator 34 is shifted at phase shifter 40 in response to the signal provided from micro-processor 46. The amplifier 42 adjusts the gain of the signal provided by the phase shifter 40. The signal provided by the amplifier 42 is the corrective reflective signal. The corrective reflective signal is received at circulator 44, which isolates the amplifier 42 and the corrective signal from antenna 32. The circulator 44 provides the corrective reflective signal to the circulator 30.

Circulator 30 receives the forward signal at port A and receives the reflective signal at port C. Port B of circulator 30 is connected to the antenna 32. Circulator 30 combines the forward signal and the reflective signal, determining the complex impedance used to tune the RF power amplifier. Antenna 32 is isolated from the RF power amplifier as a result of the function of the circulator 30.

What is claimed is:

1. An active load impedance control system for a radio frequency power amplifier comprising:
   amplification means for amplifying radio frequency signals and providing forward signal;
   control means responsive to the operating conditions of said amplification means,
   correction signal means responsive to the control means for providing an amplitude and phase controlled corrective reflective signal.
   combining means for combining said forward signal and said corrective reflective signal.

2. The active load impedance control system for the radio frequency power amplifier for claim 1 wherein said combining means includes at least one circulator for combining said forward signal said corrective reflective signal.

3. The active load impedance control system for the radio frequency power amplifier of claim 1, wherein said control means includes micro-processor control circuitry.

4. The active load impedance control system for the radio frequency power amplifier of claim 1, wherein said control means is responsive to changes in the output of said amplifier, supply voltage and operating frequency.

5. The active load impedance control system for radio frequency power amplifier of claim 1 wherein, said correction signal means includes a variable attenuator for varying the amplitude of said corrective reflective signal.

6. The active load impedance control system for radio frequency power amplifier of claim 1, wherein said correction signal means includes a phase shifter for shifting the phase said corrective reflective signal.

7. The active load impedance control system for radio frequency power amplifier for claim 1, wherein said correction signal means includes an amplifier to vary the gain of said corrective reflective signal.

* * * * *

UNITED STATES PATENT AND TRADEMARK OFFICE
CERTIFICATE OF CORRECTION

PATENT NO. : 4,985,686

DATED : January 15, 1991

INVENTOR(S) : Davidson, et al

It is certified that error appears in the above-identified patent and that said Letters Patent is hereby corrected as shown below:

COLUMN 4:

Claim 1, line 20, after "providing" and before "forward" the article -- a -- should be inserted.

Claim 1, line 4, after "signal" delete ";" and insert therefor -- , --.

Claim 1, line 9, after "signal" delete "." and insert therefor -- , and --.

Claim 2, line 4, after "signal" and before "said" insert -- and --.

Signed and Sealed this

Thirtieth Day of June, 1992

Attest:

DOUGLAS B. COMER

*Attesting Officer*    *Acting Commissioner of Patents and Trademarks*